(12) United States Patent
Adamec et al.

(10) Patent No.: US 9,633,815 B1
(45) Date of Patent: Apr. 25, 2017

(54) EMITTER FOR AN ELECTRON BEAM, ELECTRON BEAM DEVICE AND METHOD FOR PRODUCING AND OPERATING AN ELECTRON EMITTER

(71) Applicant: ICT Integrated Circuit Testing Gesellschaft für Halbleiterprüftechnik mbH, Heimstetten (DE)

(72) Inventors: Pavel Adamec, Haar (DE); Harry Kleinschmidt, Feldkirchen (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/040,608

(22) Filed: Feb. 10, 2016

(51) Int. Cl.
| | |
|---|---|
| H01J 29/50 | (2006.01) |
| H01L 21/00 | (2006.01) |
| H01J 37/073 | (2006.01) |
| H01J 9/02 | (2006.01) |
| H01J 1/304 | (2006.01) |
| H01J 37/26 | (2006.01) |
| H01J 37/147 | (2006.01) |

(52) U.S. Cl.
CPC .......... *H01J 37/073* (2013.01); *H01J 1/304* (2013.01); *H01J 9/025* (2013.01); *H01J 37/1472* (2013.01); *H01J 37/26* (2013.01); *H01J 2237/06341* (2013.01); *H01J 2237/2602* (2013.01)

(58) Field of Classification Search
USPC ......... 250/306, 307, 310, 311, 396 R, 492.3, 250/526
See application file for complete search history.

(56) References Cited

U.S. PATENT DOCUMENTS

| | | | |
|---|---|---|---|
| 5,497,550 A * | 3/1996 | Trotta | B26B 21/60 30/346.53 |
| 6,387,717 B1 * | 5/2002 | Blalock | H01J 1/304 313/309 |
| 7,824,382 B2 * | 11/2010 | Reihl | A61B 5/14528 604/264 |
| 2005/0247755 A1 * | 11/2005 | Laurent | G01R 1/06711 228/101 |
| 2016/0225574 A1 * | 8/2016 | Yasaka | H01J 37/08 |

\* cited by examiner

*Primary Examiner* — Bernard Souw
(74) *Attorney, Agent, or Firm* — Kilpatrick Townsend & Stockton LLP (57) ABSTRACT

A cold field emitter for emitting an electron beam for an electron beam device is described. The emitter includes an emitter tip having a tip surface; and two or more adjacent facets formed at the tip surface and having facet boundaries, each of the facets forming a recess in the emitter tip, wherein the facets are separated. An intermediate area is provided between and around the two or more adjacent facets and the intermediate area is configured for electron emission. Further, an electron beam device, a method for operating an electron beam device and a method for producing an emitter for an electron beam device is described.

20 Claims, 4 Drawing Sheets

EMITTER FOR AN ELECTRON BEAM, ELECTRON BEAM DEVICE AND METHOD FOR PRODUCING AND OPERATING AN ELECTRON EMITTER

TECHNICAL FIELD

Embodiments of the present disclosure relate to an electron emitter source for an electron beam device, an electron beam device, a method for producing an electron emitter for an electron beam device and a method for operating an electron emitter for an electron beam device. Embodiments of the present disclosure specifically relate to an electron emitter and electron beam devices, for example, for inspection system applications, testing system applications, lithography system applications, defect review or critical dimensioning applications or the like.

BACKGROUND

Charged particle beam devices can be used, for example, in electron beam inspection (EBI), defect review and critical dimension measurement. Upon irradiation of a specimen or sample by a primary charged particle beam, signal charged particles, such as secondary electrons (SE) or backscattered charged particles, are created, which may carry information about the topography of the specimen, the chemical constituents of the specimen, the electrostatic potential of the specimen and other information about the specimen. The signal charged particles are collected and guided to a sensor, e.g., a scintillator, a pin diode or the like.

The performance of a charged particle source, such as an electron emitter, in providing the primary charged particle beam in a charged particle beam device is of particular interest. As an example, high brightness charged particle sources and/or high emission current sources with high emission stability are beneficial. The charged particle sources are operated under vacuum conditions, wherein the performance of the charged particle sources can be related to a quality of the vacuum.

As features on the specimen become smaller, the demands on the resolution and throughput of a charged particle beam device increase. One example of limitations to the throughput is the charged particle source (such as an emitter) and the ability of the charged particle source to deliver current high enough for a small focused spot (high brightness). Known systems use so called Schottky sources (standard or shelf product). Inherent limitations of the known sources originate from the operation principles. Theoretically, a higher brightness can be achieved by a source based on cold field emission and a tunneling effect through the potential barrier on the usually metallic specimen surface. Cold-field emitters do not use high temperatures for operation and the brightness is higher. However, cold field emitter sources are very sensitive to the environmental effect, especially residual gas molecules bombardment, and the emission is often not stable.

In view of the above, it is beneficial to provide an emitter for a charged particle beam, a charged particle beam device, and a method for producing and operating an emitter for a charged particle beam device that overcome at least some of the problems in the art.

SUMMARY

In light of the above, a cold-field emitter, an electron beam device, and a method for producing and operating an emitter for an electron beam device according to the independent claims are provided. Further aspects, advantages, and features are apparent from the dependent claims, the description, and the accompanying drawings.

According to one embodiment, an electron beam device for inspecting a specimen with an electron beam, the electron beam device having an optical axis, is provided. The electron beam device includes an electron beam source including a cold field emitter for emitting a primary electron beam. The cold field emitter includes an emitter tip having an emitter tip surface and two or more adjacent facets formed at the emitter tip surface. Each of the two or more facets forms a recess in the emitter tip, wherein the two or more facets are separated. An intermediate area is provided between and around the two or more adjacent facets, wherein the intermediate area is configured for electron emission. The electron beam source further includes an extractor device for applying an extraction voltage between the cold field emitter and the extractor device. The electron beam device further includes electron beam optics for directing and focusing the primary electron beam onto the specimen and a detector device for detecting secondary charged particles generated at an impingement or hitting of the primary electron beam on the specimen.

According to one embodiment, a cold field emitter for emitting an electron beam for an electron beam device is provided. The cold field emitter includes an emitter tip having a tip surface and two or more adjacent facets formed at the tip surface and having facet boundaries, each of the two or more facets forming a recess in the emitter tip, wherein the two or more facets are separated. An intermediate area is provided between and around the two or more adjacent facets, wherein the intermediate area is configured for electron emission.

According to another embodiment, a cold field emitter for emitting an electron beam for an electron beam device is provided. The cold field emitter includes an emitter tip having a tip surface. The emitter tip is a crystalline emitter tip, especially a monocrystalline emitter tip. The emitter tip surface provides a first area, wherein the first area includes an emitting part extending over at least a part of the first area and extending in a 310 crystallographic plane. The emitting part of the first area is configured for electron emission. The first area of the emitter tip surface is interrupted by at least two second areas, wherein the at least two second areas of the emitter tip surface extend in a 100 and/or 110 crystallographic plane.

According to a further embodiment, a method for producing an emitter tip for a cold field emitter for a source of an electron beam is provided. The method includes providing an emitter tip having an emitter tip surface and processing the emitter tip by etching the emitter tip, heating the emitter tip, and applying an electrical field to the emitter tip. Two or more adjacent facets are formed into the emitter tip, especially by the processing the emitter tip. An intermediate area is left between and around the two or more adjacent facets, the intermediate area being configured for electron emission.

According to a further embodiment, a method for operating an electron beam device is provided. The method includes providing an electron beam source having a cold field emitter and an extractor device, wherein the cold field emitter comprises an emitter tip having a tip surface and two or more adjacent facets formed into the emitter tip. Each of the two or more facets forms a recess in the emitter tip, wherein an intermediate area is provided between and around the two or more adjacent facets. The method further includes applying an extraction voltage between the cold field emitter and the extractor device of the electron beam source and emitting electrons from the intermediate area.

Embodiments are also directed at apparatuses for carrying out the disclosed methods and include apparatus parts for performing each described method feature. These method features may be performed by way of hardware components, a computer programmed by appropriate software, by any combination of the two or in any other manner. Furthermore, embodiments are also directed at methods for operating the described apparatus. Embodiments include method features for carrying out every function of the apparatus.

BRIEF DESCRIPTION OF THE DRAWINGS

So that the manner in which the above recited features of the present disclosure can be understood in detail, a more particular description, briefly summarized above, may be had by reference to embodiments. The accompanying drawings relate to embodiments and are described in the following.

DETAILED DESCRIPTION OF EMBODIMENTS

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

Figure 1:
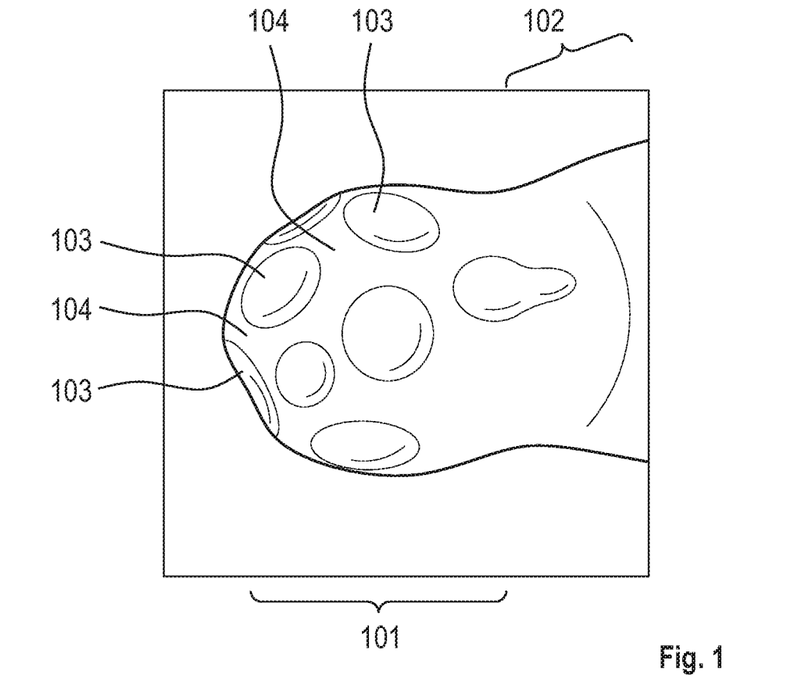
FIG. 1 shows a schematic perspective view of an emitter tip of a cold-field emitter according to embodiments described herein.

FIG. 1 shows a portion of an emitter tip 100 according to embodiments described herein. The emitter tip 100 includes a first portion 101 and a second portion 102. According to some embodiments, the first portion 101 has a substantially round (spherical) shape, such as substantially the shape of a sphere, a sphere interrupted by the interface to the second portion 102, or a substantially oval shape, an extended or elongated sphere or the like. The second portion 102 may be an emitter shank and/or may provide a lengthy shape, such as, for instance, the shape of a conical cylinder as shown in FIG. 1, or a cylinder having a substantially round base, or any suitable shape for forming the emitter for an electron beam device as described in embodiments herein.

According to some embodiments described herein, the first portion 101 and the second portion 102 are made from the same material and may be portions of a crystalline, in particular a monocrystalline, material, as will be explained in detail below.

The emitter tip 100 typically has an emitter tip surface including the surface of the first portion 101 and the second portion 102. According to embodiments described herein, the first portion 101 of the emitter tip 100 provides two or more facets 103. The facets 103 are arranged adjacent to each other. An intermediate area 104 extends between the facets 103. The surface of the first portion 101 of the emitter tip 100 may be described as being composed of the surface of the facets 103 and the surface of the intermediate area 104.

According to embodiments described herein, the term "facet" as used herein may be described as a recess in the emitter tip. In some embodiments, the facet may have a certain thickness extending into the emitter tip. The thickness of the facet may be defined as the deepness of the recess. Typically, the thickness of the facet may vary over the area or size of the facet. For instance, the facet may have a shape and thickness as if a small sphere was pressed into the emitter tip leaving an impression in the emitter tip (although the production method may be different, as will be referred to in detail below). A facet as used herein may include a facet that is not flat. According to some embodiments, a facet as described herein having a substantially round shape may be understood in that the facet has for instance a circular shape, an oval shape, a long hole shape, an irregular circular shape and the like. In some embodiments, the substantially round shape of a facet may be described as the absence of a corner in the circumference of the facet.

The facets according to embodiments described herein each may have a facet boundary delimiting the facet size. A facet boundary may be described as the line, where the facet ends and the intermediate area begins. As can exemplarily be seen in FIGS. 1 and 2, the facets are distinct facets, which are separated from each other. According to some embodiments, the facets, in particular adjacent facets, do not contact each other at the facet boundaries, but leave the intermediate area in between. According to some embodiments, adjacent facets may be described as two facets having the smallest distance to a respective next one of the facets.

Typically, the intermediate area may be a smooth area, i.e. a continuous area allowing for an electron emission with low working function as compared to the working function of the facets. The intermediate area can be used for the electron emission.

According to some embodiments described herein, a smooth and continuous area being located between the facets of an emitter tip as described herein may be understood as an area capable of emitting electrons. Typically, the intermediate area may have a certain size, wherein one dimension of the size corresponds to the distance between the facets. In particular, the intermediate area provides a certain size compared to an edge or a line (e.g. between contacting facets, a cube surface or a polyhedron surface). According to some embodiments, the intermediate area may be an interconnected area extending between and around the facets or an area corresponding to the surface of (the first portion of) the emitter tip minus the area (or size) of the facets.

In some embodiments, the intermediate area being configured for emitting electrons or an electron beam may for instance be configured for the function by the orientation to the optical axis, the size of the intermediate area, the continuity of the intermediate area, the smoothness of the intermediate area, the distance between the distinct facets, the shape of the intermediate area, the shape of the surface of the intermediate area and the like. The intermediate area may include the area with the lowest working function for emitting electrons on the emitter tip. Further, several parameters (including additional parameters to the above named parameters) may influence the working function of the different areas of the emitter tip.

According to some embodiments, the intermediate area may have a bent shape, such as a shape having a curvature with a radius between about 50 nm and about 1000 nm, more typically between about 50 nm and about 500 nm, and even more typically between about 150 nm and about 300 nm or between about 200 nm and about 30 nm. A "smooth" intermediate area may be understood in that the radius of the curvature of the intermediate area is greater than about 50 nm. Compared to an intermediate area according to embodiments described herein, an edge (e.g. of a polyhedron emitter tip) may have a radius which is typically about ten times or more less than the radius of the intermediate area between two adjacent, separated facets according to embodiments described herein.

According to some embodiments, a smooth or continuous intermediate area may be understood as an area including several adjacent atoms, where the locations of two adjacent atoms have a limited distance or offset to each other in at least one direction (e.g. the direction of the optical axis). For instance, the locations of two adjacent atoms in the intermediate area have an offset to each other in one direction that is equal to or less than the size of the atoms, or equal to or less than half the size of the atoms. Comparing the intermediate area to an edge of—for instance—a cubic emitter tip, the locations of two adjacent atoms of an edge are at a comparatively large distance from each other, such as a distance or offset larger than the size of the atoms. In some cases, the location of adjacent atoms of an edge may be unstable and change from time to time (such as atoms "jumping" from one position to another one).

According to embodiments described herein, the emitter referred to herein is a cold field emitter. A cold field emitter may be understood as an emitter which can be operated at low temperatures, such as ambient temperature. In some examples, the cold field emitter may be operated and may emit electrons at temperatures ranging up to a few 100° K., or even up to 1000° K. According to some embodiments, the cold field emitter may be operated at temperatures below ambient temperature, such as temperature below 293° K. A cold field emitter is able to be operated at the above named temperatures and is able to emit a sufficient electron beam for the operation of an electron beam device. For instance, the emitter is adapted by the material of the emitter or the geometry of the emitter for operating at the above named temperatures.

Figure 2:
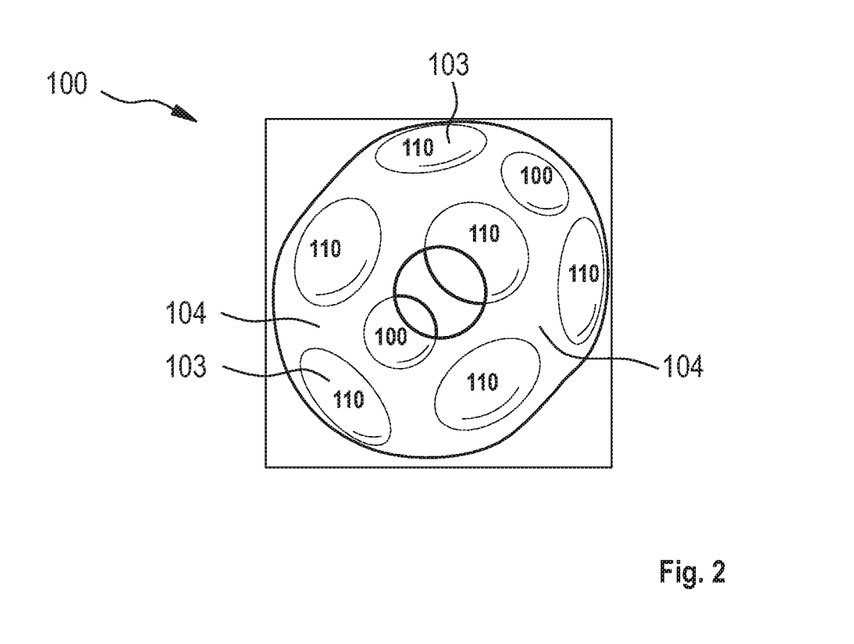
FIG. 2 shows a schematic bottom view of the emitter tip shown in FIG. 1.

As can exemplarily be seen in FIG. 2, the facets 103 having a substantially round shape may have different sizes, in particular different sizes within a defined range. The size of the facets may be understood as the area surrounded by the circumference of the facets, in particular the circumference contacting the intermediate area, i.e. the facet boundary.

As mentioned above, the emitter tip may be a crystalline emitter tip, in particular a monocrystalline emitter tip. Typically, a monocrystalline emitter tip does not have grain boundaries. A monocrystalline emitter tip can be beneficial with regard to mechanical and electrical properties of the tip, such as thermal conductivity, creeping, precipitation, and corrosion. In one example, the emitter tip may be made from metal, such as tungsten. In some embodiments, the emitter tip may be made from a refractory material or refractory metal. According to some embodiments, the emitter tip may include or may be made of tantalum, rhenium, molybdenum, niobium, platinum, iridium, a carbide material (such as hafniumcarbine, tantalumcarbide, titaniumcarbine), and/or a boride material (such as Lanthanhexaboride). In some embodiments, which may be combined with other embodiments described herein, the emitter tip may be made from one single material only, such as tungsten.

FIG. 2 shows a bottom view of the emitter tip 100 shown in FIG. 1 according to embodiments described herein. The bottom view of FIG. 2 shows the intermediate area 104 emitting the electron beam upon operation, as also schematically shown in FIGS. 5 and 6. The example of a bottom view of an emitter tip according to embodiments described herein shows eight facets 103. Each of the facets wears a number being either 110 or 100, which corresponds to the orientation of the facet in the crystallographic planes of the emitter tip according to the Miller indices. According to some embodiments, the intermediate area or the part of the intermediate area emitting the electron beam may have a 310 orientation, in particular a 310 orientation to the optical axis of the electron beam device, in which the emitter is to be used.

According to embodiments described herein, an emitter tip as described herein may provide a stable emission of an electron beam as well as a long emitter tip life time with less maintenance interruptions compared to known systems.

Several attempts have been made in the past to improve the stability of an emitter emission. For instance, by improving the vacuum surrounding the emitter tip, the stability can be improved. Emitter tips surrounded by an improved vacuum have been applied in the commercial SEM (Scanning Electron Microscopy) and TEM (Transmission Electron Microscopy) instruments. However, the current stability is still not sufficient for applications in automated wafer inspection system, where a higher precision and a high throughput are beneficial.

Further, in known systems, either polyhedron emitter tips or round emitter tips are used. Processing of the emitter tip at high temperatures often tends to create a crystallite in a form of a polyhedron. The crystalline structure of a polyhedron is considered stable even at high processing temperatures. However, from a point of view of emission stability, the polyhedron shape has some drawbacks. For instance, at the edges between the crystallographic planes, there is a higher local field during operation and, consequently, a higher emission. The emission of the edges is usually less stable than the emission from the flat surfaces of the polyhedron. The polyhedron shape has negative impacts on the total emission stability of the emitter tip.

In another case of a known system, if the processing temperature of an emitter tip is further increased (compared to the processing of a polyhedron shaped emitter tip), the emitter tip provides a round shape. The round shape may be beneficial from the point of view of emission stability.

However, the round shape is difficult to keep stable during the long period of operation of the emitter tip. The round emitter tip is cleaned periodically by heating to high temperatures. If the temperature is high enough to deliver the round shape, the high temperature leads at the same time to a continuous increase in the emitter radius and, consequently, to a limited lifetime of the emitter tip. Most of the emitter tips used today use the round emitter tip shape and the method of periodical cleaning.

The emitter tip according to embodiments described herein allows for solving the aforementioned problems of instable emission and unduly limited lifetime of the emitter tip. For instance, the intermediate area being a continuous, smooth area has a lower working function for emitting electrons than the facets. The electron beam emitted is sub-emitted from the intermediate area, which—inter alia due to the size of the intermediate area between the distinct facets and distance between the distinct facets—allows for a stable emission. In one example, the working function of the intermediate area is about 10% higher than the working function of the facets. The 10% difference may result in a difference in electron emission of up to 100% between the intermediate area and the facets.

According to embodiments described herein, the above described orientation of the facets and the part of the intermediate area emitting the electrons is beneficial for the stable operation of the emitter tip during a long life cycle. With the geometry of the emitter tip according to embodiments described herein, the emitter can be used for applications in an automated processing line, such as an automated wafer inspection SEM tool. Having an electron beam device with the emitter according to embodiments described herein allows for a fast production and consecutive inspection. A fast production and inspection in turn spares costs and reduces the cost of ownership.

In the following figures, some features of embodiments of an emitter tip are described. The different features may arbitrarily be combined with each other as long as the features do not contradict each other. The following features—although described with respect to a single embodiment—can be combined in one or more emitter tips according to embodiments.

Figure 3:
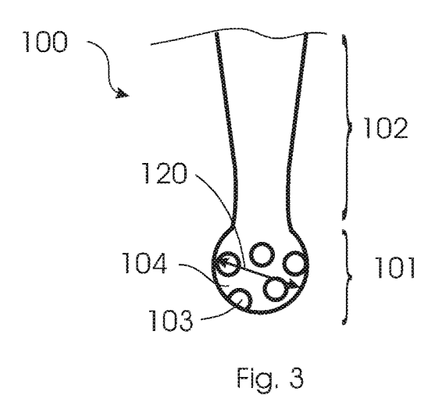
FIG. 3 shows a schematic side view of an emitter tip of a cold-field emitter according to embodiments described herein.

FIG. 3 shows an emitter tip 100 with a first portion 101 being simplified shown as a substantially circular portion and a second portion 102 forming the emitter tip shank. In FIG. 3, several facets 103 are shown having a substantially circular shape in the example of FIG. 3. The first portion 101 and the second portion 102 of the emitter tip may merge into each other. According to some embodiments, a continuous transition may be formed between the first portion 101 and the second portion 102 of the emitter tip 100. The diameter 120 of first portion 101 is indicated in FIG. 3. According to some embodiments described herein, the diameter 120 of the first portion is typically between about 50 nm and about 2000 nm, more typically between about 100 nm and about 1000 nm, and even more typically between about 300 nm and about 600 nm.

Figure 4:
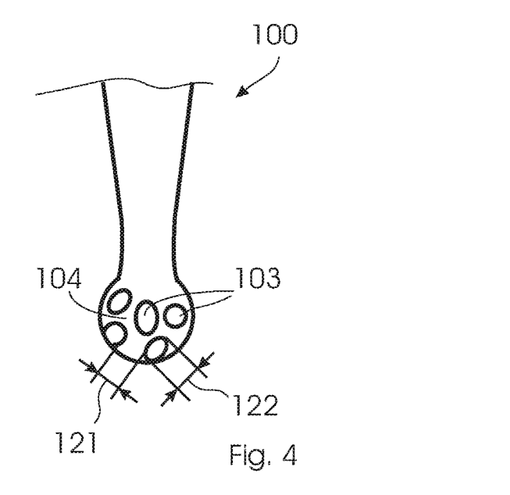
FIG. 4 shows a schematic side view of an emitter tip of a cold-field emitter according to embodiments described herein.

FIG. 4 shows an embodiment of an emitter tip 100 having facets 103 and an intermediate area 104 between and around the facets 103. In the example of FIG. 4, the facets provide a substantially round shape. Some facets 103 in FIG. 4 are exemplarily shown having an oval rather than a circular shape. The shape of the distinct facets may vary in shape and size within defined ranges. In some embodiments, the diameter of a facet as referred to herein may be described as being one diameter of a facet (e.g. the tallest diameter). According to some embodiments, the facets may have a diameter of typically between about 20 nm and about 200 nm, more typically between about 50 nm and about 150 nm, and even more typically between about 70 nm and about 120 nm.

In some embodiments, which may be combined with other embodiments described herein, the number of facets formed into the emitter tip may typically be between 5 and 30, more typically between 5 and 25, and even more typically between 10 and 20. The shape of the distinct facets may for instance be, as described above, substantially round, which exemplarily (and in a non-limiting way) includes substantially circular, an oval shape, an elongated circular shape and the like.

The term "substantially" as used herein may mean that there may be a certain deviation from the characteristic denoted with "substantially." For instance, the term "substantially circular" refers to a shape which may have certain deviations from the exact circular shape, such as a deviation of about 1 to 10% of the general extension in one direction.

FIG. 4 shows an example of a distance 121 between two adjacent distinct facets 103. The distance 121 extends from the boundary of a first facet to the boundary of a second facet adjacent to the first facet. According to some embodiments, the distance between two facets may typically be between about ⅙ and about ¾, more typically between about ¼ and about ¾ and even more typically between about ¼ and about ½ of the diameter of one facet. Typically, the distance 121 may correspond to the width of the intermediate area between two facets. In some embodiments, which may be combined with other embodiments, the width of the intermediate area 104 may typically include between about 150 atoms and about 500 atoms, more typically between about 150 atoms and about 400 atoms and even more typically between about 200 atoms and about 300 atoms forming the portion of the intermediate area between two adjacent facets. The number of atoms may depend on the radius or diameter of the respective emitter tip portion. For instance, the width may include 200 atoms at a radius of about 250 nm of the first portion of a tungsten emitter tip. According to some embodiments, the atoms of the intermediate area form a continuous surface, as described above. The distance between the facets results in distinct and separated, adjacent facets being formed into the emitter tip.

Some (e.g. a few) of the adjacent facets of the emitter tip may be allowed to contact each other at the boundary as long as an intermediate area is present being large enough to provide a stable electron emission. For instance, the boundaries of two facets may be in contact with each other in a part of the emitter tip that substantially does not emit electrons, such as a part of the emitter tip near the second portion 102. According to some embodiments described herein, the boundaries of the facets may be in contact with each other as long as a portion of the intermediate area being oriented in a 310 plane (or, alternatively at the bottom part of the emitter tip) is large enough to provide a stable electron emission.

Figure 5:
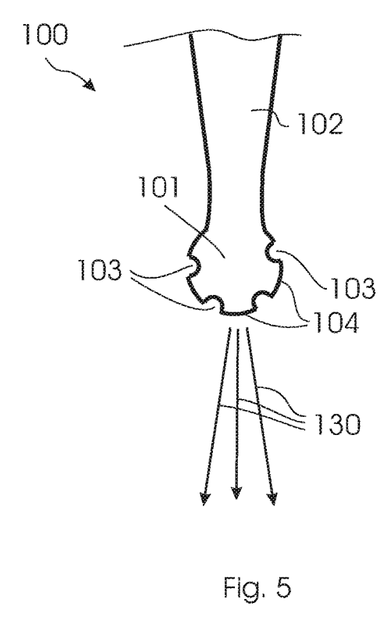
FIG. 5 shows a schematic sectional view of an emitter tip of a cold-field emitter according to embodiments described herein.

FIG. 5 shows a schematic sectional view of an emitter tip 100, e.g. along an optical axis of an electron beam device, in which the emitter tip is to be used. According to some embodiments, the emitter tip 100 shown in FIG. 5 may be an emitter tip as described in embodiments above. In the sectional view, the facets 103 of the first portion 101 of the emitter tip can be seen as recesses in the emitter tip having a certain depth. Also, the intermediate area 104 can be seen between the facets 103. According to some embodiments, the intermediate area 104 being oriented in a 310-orientation according to the Miller indices emits an electron beam 130 upon operation of the emitter tip, e.g. upon application of an extraction voltage between the emitter tip and an extractor device (not shown in FIGS. 5 and 6). As explained above, the intermediate area 104 emitting the electron beam 130 may include about 200 atoms arranged between two adjacent and distinct facets 103.

Figure 6:
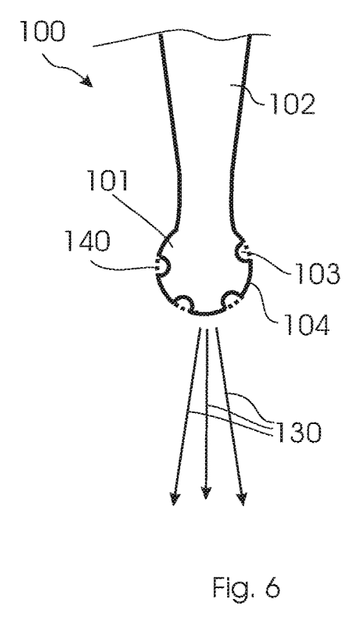
FIG. 6 shows a schematic sectional view of an emitter tip of a cold-field emitter according to embodiments described herein.

FIG. 6 shows a schematic sectional view of an emitter tip 100 having a first portion 101, a second portion 102, facets 103 and an intermediate area 104. The emitter tip 100 may be an emitter tip as described in embodiments above. FIG. 6 also shows a shell 140 in dashed lines including the intermediate area 104. The shell 140 including the intermediate area 104 has a round (or bent), continuous shape. The intermediate area 104 can be described as having a rounded surface corresponding to the curvature of the surface of an emitter tip without facets.

Figure 7:
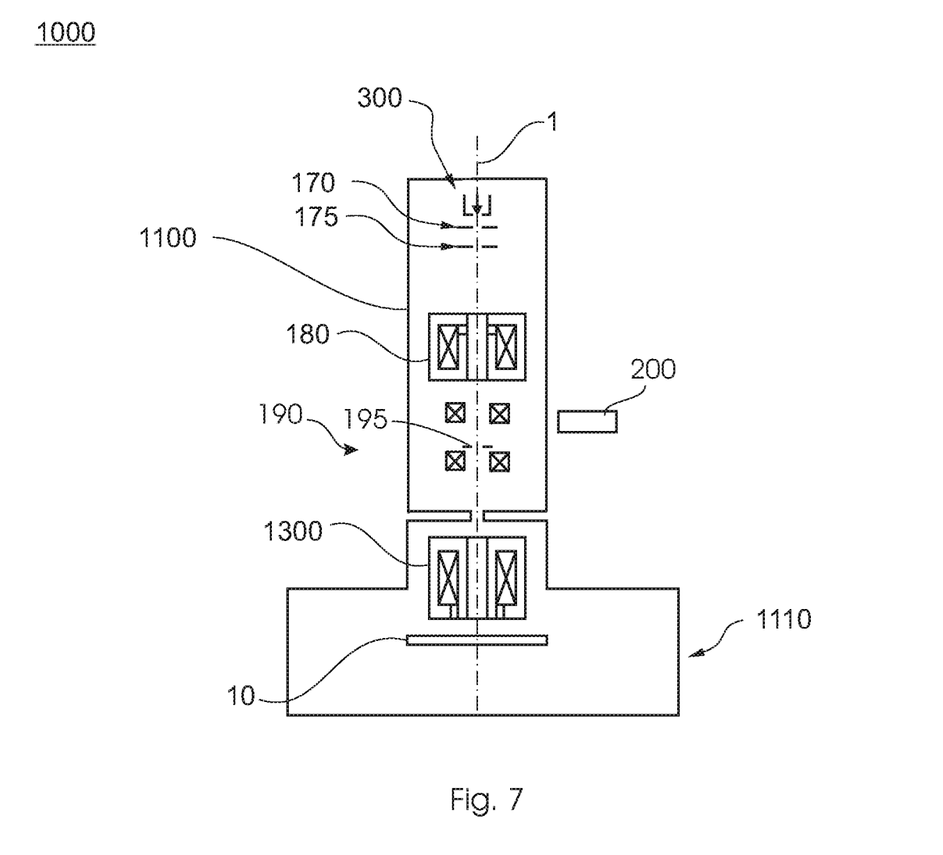
FIG. 7 shows a schematic view of an electron beam device according to embodiments described herein.

FIG. 7 shows a schematic view of an example of an electron beam device 1000 having an electron beam source with an emitter and an emitter tip 100 according to embodiments described herein. The electron beam device 1000 according to embodiments described herein can for example be an electron microscope, such as a scanning electron microscope (SEM) or a scanning transmission electron microscope (STEM). In particular, an electron microscope can for example be an electron microscope for critical dimensioning (CD), defect review (DR), or inspection (EBI, that is electron beam inspection).

In an electron beam device, the performance of an electron beam source (e.g., a gun performance) may be considered with respect to a total performance of the electron beam device. For instance, a high vacuum (low pressure) can be provided for electron beam sources, e.g., in a range of $10^{-7}$ to $10^{-9}$ Pa, or even below $10^{-10}$ Pa around the electron beam source, e.g. within a housing 1100. Also a low partial pressure of at least some residual gases, which may poison the electron emitter is beneficial. For example, oxygen can have a negative impact on the work function of an emitter material and on the electron emission. For achieving suitable vacuum conditions, a vacuum pumping device can be provided and can be selected from the group consisting of a turbo molecular pump, an ion getter pump, such as a non-evaporable getter pump, a cryopump, and any combination of the aforementioned devices.

According to some embodiments described herein, the electron beam device 1000 can include an electron beam source 300 located in a housing 1100, and a sample chamber 1110 connected to the housing 1100. In some implementation, a separate sample chamber vacuum generation device can be connected to the sample chamber 1110. In alternative embodiments, all elements may be arranged within one housing or chamber.

A sample 10 or specimen can be provided in the sample chamber 1110. The sample 10 can be provided on a sample support (not shown). The sample support can be a movable stage for positioning the sample 10. For example, the movable stage can be configured for moving the sample 10 in one direction (e.g. X direction) or in two directions (e.g. X-Y-directions).

A sample or specimen as referred to herein, includes, but is not limited to, semiconductor wafers, semiconductor workpieces, and other workpieces such as memory disks and the like. Embodiments of the disclosure may be applied to any workpiece on which material is deposited or which are structured. A sample or specimen can include a surface to be structured or on which layers are deposited, e.g. an edge, a bevel, or the like.

The electron beam source 300 generates the primary electron beam. According to some embodiments, which can be combined with other embodiments described herein, the electron beam source 300 includes an emitter having an emitter tip 100 according to embodiments described above being e.g. a cold field emitter.

The primary electron beam is guided in the electron beam device 1000 along the optical axis 1 and is focused on the sample 10 by an objective lens 1300. The objective lens 1300 is exemplarily shown within the sample chamber 1110. According to some embodiments, the objective lens 1300 images, for example, the emitter tip 100 of the electron beam source on the sample 10. In some implementations, the objective lens 1300 can be provided by a magnetic lens portion and an electrostatic lens portion. According to some embodiments, which can be combined with other embodiments described herein, a deceleration of the primary electron beam can be provided, for example, in the vicinity of the sample 10, in or behind the objective lens 1300, or a combination thereof. For example, according to some embodiments, a retarding bias voltage can be applied to the sample 10. The objective lens 1300 can be an electrostatic-magnetic compound objective lens having e.g. an axial gap or a radial gap, or the objective lens 1300 can be an electrostatic retarding field lens.

According to embodiments described herein, a condenser lens 180 can be provided. The condenser lens 180 can be magnetic and have pole pieces and one or more coils. Alternatively, the condenser lens 180 can be electrostatic or combined magnetic-electrostatic. According to some embodiments, the condenser lens may be an immersion condenser lens.

In some embodiments, the electron beam source 300 may include at least one of an extractor device 170 and an anode 175. The extractor device 170 can be configured for providing a voltage difference to the emitter tip 100 for causing electron emission. The anode 175 can be configured to accelerate the primary electron beam. As an example, the anode 175 can be configured to accelerate the primary charged particle beam so that the primary charged particle beam has a predetermined energy when the primary charged particle beam passes along the optical axis 1 of the electron beam device. In some implementations, the energy of the primary electron beam leaving the extractor device 170 and/or the anode 175, can be in a range of 5 keV or above, specifically in a range of 10 keV to 50 keV, and more specifically about 15 or 40 keV. According to some embodiments, in transmission electron microscopes (TEM) and scanning transmission microscopes (STEM) the beam energy can even exceed 100 keV.

In some embodiments, a beam deflection device 190 is provided for deflecting and guiding the electron beam. According to some embodiments, a signal charged particle beam is released or backscattered from the sample when the primary hits or impinges the specimen or sample 10. The signal (or secondary) charged particle beam may be separated from the primary charged particle beam by means of the beam deflection device 190 according to some embodiments described herein. The beam deflection device 190 can include at least one of a beam splitter and a beam bender, one or more apertures, such as a spray aperture or knife edge aperture 195, or any combination thereof. The signal charged particle beam may be guided towards a detector assembly or a detector device 200, which can include a sensor, such as a scintillator, pin diode etc.

It is to be understood that one or more other optical components like alignment systems, correction systems, further detection systems etc. that are not shown in the present figures can be provided in embodiments of the electron beam device.

Elements described for the electron beam device like condenser lenses, apertures, deflectors and other optical components may be referred to as charged particle beam optics for directing and focusing the electron beam device to the specimen.

Figure 8:
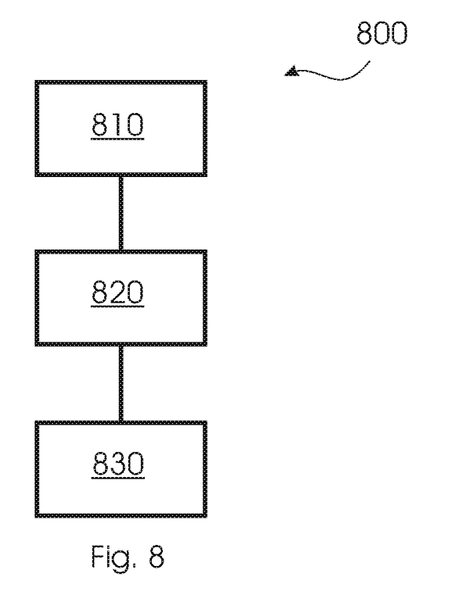
FIG. 8 shows a flow chart of a method for operating an emitter for an electron beam device according to embodiments described herein.

According to some embodiments, a method for operating an electron beam device is described. FIG. 8 shows a flowchart of method 800 according to embodiments described herein. In block 810, the method 800 may include providing an electron beam source and an extractor device. For instance, the extractor device may be an electrode connected to a power supply. According to some embodiments, the electron beam source may be an electron beam source as described above e.g. with respect to FIG. 7 having an extractor and an emitter. Typically, the electron beam source includes an emitter tip. The emitter tip provides an emitter tip surface and two or more adjacent facets formed into the emitter tip. According to embodiments described herein, a facet forms a recess in the emitter tip. The emitter tip further comprises an intermediate area between and around the at least two adjacent facets. According to some embodiments, the emitter tip as used for the operation of the electron beam device may be an emitter tip as shown and described in the FIGS. 1 to 6. In particular, the facets may for instance have a round shape, such as a substantially circular or oval shape or the shape of an elongated circle. According to embodiments described herein, the emitter tip may be a crystalline emitter tip and the facets in the emitter tip may lie in the 100 and/or 110 crystallographic planes. In some embodiments, the emitter tip provided in block 810 may be a monocrystalline emitter tip.

In some embodiments, the intermediate area may have a smooth or continuous surface providing an area for stable electron emission. In one example, a shell (such as shell 140 exemplarily shown in FIG. 6) including the intermediate area may have a round shape, e.g. the shape of a sphere or an oval shape. The intermediate area may have a bent surface. According to some embodiments, the surface of a first portion of the emitter tip is composed of the intermediate area and the surface of the facets.

According to embodiments described herein, the method 800 further includes in block 820 applying an extraction voltage between the electron beam source and the extractor device. For instance, a voltage of a few kV may be applied to an electrode of the extraction device (such as electrode of the extractor device 170 shown in FIG. 7). For instance, the voltage applied to the electrode of the extraction device may typically be between about 2 kV and about 30 kV, more typically between about 5 kV and 20 kV, such as about 10 kV. In some embodiments, an acceleration electrode may be provided after the extraction device along the optical axis, such as acceleration electrode provided by the anode 175 in FIG. 7. The acceleration electrode may be connected to a power supply and can be configured to bias the extractor device to a second potential. A voltage difference between the acceleration electrode provided by the anode 175 and the extractor device 170 can be larger than 100 kV. As an example, the voltage difference can be in a range of 0 to 40 kV, specifically in a range of 0 to 10 kV, and more specifically in a range of 5 to 30 kV. In some SEM applications the voltage difference can be in a range of 5 to 30 kV. In TEM the voltage can be larger than 100 kV.

According to embodiments described herein, in block 830, electrons are emitted from the intermediate area of the emitter tip. As described in detail above, the emitting part of the intermediate area (which extends between the facets) may be arranged in the 310 crystallographic plane according to the Miller indices. According to some embodiments, the part of the intermediate area emitting the electrons may have a width of about 200 atoms, as can be seen in FIGS. 4 and 5. The intermediate area may be described as the area between the facets, wherein the distance between two adjacent facets is one dimension of the intermediate area. Compared to an edge, the intermediate area allows for a stable electron emission, e.g. due to the continuous surface having atoms located at a limited distance from each other at least in one direction.

In some embodiments, which may be combined with other embodiments described herein, the method 800 for operating an electron beam device may further include deflecting, focusing and guiding the (primary) electron beam to a specimen to be inspected. For instance, FIG. 7 shows an example of elements and devices, which may be used for directing and focusing the electron beam on a specimen location, such as condenser lenses, objective lenses, deflector devices, apertures and the like. Also, the method 800 may include detecting secondary charged particles released or backscattered from the specimen upon impingement of the primary electron beam. A detection device may be provided in method 800 for detection purposes.

Figure 9:
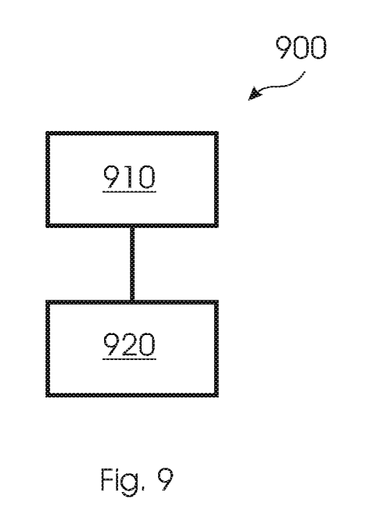
FIG. 9 shows a flow chart of a method for producing an emitter tip for an emitter according to embodiments described herein.

According to some embodiments, a method for producing an emitter tip for an emitter for a source of an electron beam is described. FIG. 9 shows a flowchart of a method 900 for producing an emitter tip according to embodiments described herein. In block 910, the method 900 includes providing an emitter tip having an emitter tip surface. In particular the emitter tip may comprise a monocrystalline material. In one example, the emitter tip provided may have a first portion being substantially round (e.g. by having substantially the shape of a sphere, an oval shape, the shape of an elongated sphere or the like) and a second portion (e.g. a shank of the emitter tip, as described with respect to FIG. 1).

According to some embodiments, in block 920, the emitter tip is processed by at least one of etching the emitter tip, heating the emitter tip, and applying an electrical field to the emitter tip. For instance, the emitter tip may be heated to a high temperature in the range of about 2000K, such as to a temperature typically between about 1600° K. to about 2200° K., more typically between about 1700° K. and about 2100° K., and even more typically between about 1700° K. and about 2000° K. For instance, the emitter tip may be heated to a high temperature in the range of about 2000K. In some embodiments, the application of an electrical field may be performed with an electrical field in the range of several MV/mm. For instance, the electrical field may typically be between about 2 MV/mm and about 5 MV/mm, more typically between about 3.5 MV/mm and about 5 MV/mm and even more typically between about 3.5 MV/mm and about 4.5 MV/mm. In one example, the electrical field strength may be about 4 MV/mm. According to some embodiments, the relation of the chosen value for the electrical field and the chosen value for the temperature can be considered. According to some embodiments, the etching process may be performed with etching materials, which are able to etch the (crystalline) material of the emitter tip (e.g. tungsten or other refractory metals). The emitter tip is processed to give the specific shape of the emitter tip, especially a shape wherein two or more adjacent facets are formed at the tip surface, and wherein an intermediate area is left between and around the two or more adjacent facets.

Typically, the intermediate area is configured for electron emission. In particular, the shape of the emitter tip obtained by method 900 may be the shape as described in detail with respect to FIGS. 1 to 6.

In some embodiments, the processing yields several distinct facets in the 100 and 110 crystallographic planes of the emitter tip. Typically, the intermediate area between the 100 and 110 facets is able to emit the electrons, which is extracted and forms the electron beam along the optical axis of an electron beam device (in which the emitter tip is to be used). According to some embodiments, the processing parameters are chosen and applied for forming facets having a substantially round form.

As described above, the facets formed by the processing in block 920 each may have a facet boundary. Typically, the distinct and separated facets do not contact each other at the respective boundaries (see distance 121 between adjacent separated facets in FIG. 4). Some (or a few) of the facets may contact each other at the boundaries (e.g. at a small portion of the boundary), as long as the intermediate area is large enough to provide an area for a stable electron emission.

According to an aspect, which may be combined with the embodiments described herein, a cold field emitter for emitting an electron beam for an electron beam device may be provided. The cold field emitter may include an emitter tip 100 having a tip surface. The emitter tip may be a crystalline emitter tip, especially a monocrystalline emitter tip. The emitter tip surface provides a first area, wherein the first area includes an emitting part extending over at least a part of the first area and extending in a 310 crystallographic plane (according to the Miller indices) and wherein the emitting part of the first area is configured for electron emission. For instance, the emitting part of the first area is located at the bottom of the emitter tip, as exemplarily shown in FIGS. 5 and 6. According to some embodiments, the first area of the emitter tip surface is interrupted by at least two second areas, wherein the at least two second areas of the emitter tip surface extend in a 100 and/or 110 crystallographic plane (according to the Miller indices). According to some embodiments, which may be combined with other embodiments described herein, the at least two second areas of the emitter tip surface may be recessed compared to the first area of the emitter tip surface. In some examples, the at least two second areas may have a substantially round shape, and may in particular be substantially round facets. According to some embodiments, the first area may be described as extending between the at least two second areas.

According to some embodiments described herein, the at least two second areas may be at least two adjacent, separated facets. In some embodiments, the first area may be described as intermediate area extending between and around the at least two second areas. In some embodiments, the first area may have a curvature corresponding substantially to the radius of a first portion of the emitter tip, as for instance shown in FIG. 1. According to some embodiments, the features described herein with respect to the facets may be applied to the at least two second areas (such as size, shape, production method, working function, effect and the like). The features described herein with respect to the intermediate area may be applied to the first area (such as features referring to the size, shape, production method, working function, effect and the like). Further, the emitter may have the herein described features, such as regarding shape, size, material composition, application field and the like.

According to some embodiments, which may be combined with other embodiments described herein, an electron beam device may be described having an electron beam source including a cold field emitter for emitting a primary electron beam. The cold field emitter may include an emitter tip having a tip surface. The emitter tip may be a crystalline emitter tip, especially a monocrystalline emitter tip. The emitter tip surface provides a first area, wherein the first area includes an emitting part extending over at least a part of the first area and extending in a 310 crystallographic plane (according to the Miller indices) and wherein the emitting part of the first area is configured for electron emission. According to some embodiments, the first area of the emitter tip surface is interrupted by at least two second areas, wherein the at least two second areas of the emitter tip surface extend in a 100 and/or 110 crystallographic plane (according to the Miller indices). The electron beam source may further include an extractor device for applying an extraction voltage between the emitter and the extractor device. According to some embodiments, the electron beam device may include electron beam optics for directing and focusing the primary electron beam onto the specimen, and a detector device for detecting secondary charged particles generated at an impingement or hitting of the primary electron beam on the specimen. In some embodiments, the electron beam device may be an electron beam device as shown and described in embodiments, and especially as shown and described with respect to FIG. 7.

According to an aspect, a method for producing an emitter tip for an emitter for a source of an electron beam is described. The method includes providing an emitter tip having an emitter tip surface; and processing the emitter tip by etching the emitter tip, heating the emitter tip, and applying an electrical field to the emitter tip; wherein a first area is formed including an emitting part extending over at least a part of the first area and extending in a 310 crystallographic plane (according to the Miller indices) and wherein the emitting part of the first area is configured for electron emission. Further, two or more second areas are formed interrupting the first area of the emitter tip surface, wherein the at least two second areas of the emitter tip surface extend in a 100 and/or 110 crystallographic plane (according to the Miller indices).

According to a further aspect, a method for operating an electron beam device is described. The method includes providing an electron beam source having a cold field emitter and an extractor device, wherein the emitter comprises an emitter tip having a tip surface. The emitter tip surface provides a first area, wherein the first area includes an emitting part extending over at least a part of the first area and extending in a 310 crystallographic plane (according to the Miller indices). According to some embodiments, the first area of the emitter tip surface is interrupted by at least two second areas, wherein the at least two second areas of the emitter tip surface extend in a 100 and/or 110 crystallographic plane (according to the Miller indices). The method further includes applying an extraction voltage between the emitter and the extractor device of the electron beam source; and emitting electrons from the first area, especially from the emitting part of the first area of the emitter tip surface.

According to some embodiments, the methods for producing and operating an emitter with an emitter tip having a first area and two or more second areas may have further features, such as features described above in detail with respect to the methods for producing and operating an emitter with an emitter tip having two or more facets and an intermediate area between and around the facets configured for electron emission.

In the description, reference is made to electron beam devices and an emitter for emitting electrons. The emitter according to embodiments described herein may also be used for emitting other charged particles. For instance, the adaption of some parameters, like the emitter tip material or the like may lead to further application possibilities.

While the foregoing is directed to embodiments, other and further embodiments may be devised without departing from the basic scope, and the scope is determined by the claims that follow.

The invention claimed is:

1. An electron beam device for inspecting a specimen with an electron beam, the electron beam device having an optical axis and comprising:
   an electron beam source comprising a cold field emitter for emitting a primary electron beam, the cold field emitter comprising:
      an emitter tip having an emitter tip surface; and
      two or more adjacent facets formed at the emitter tip surface, each of the two or more facets forming a recess in the emitter tip, wherein the two or more facets are separated;
      wherein an intermediate area is provided between and around the two or more adjacent facets, wherein the intermediate area is configured for electron emission;
   the electron beam source further comprising an extractor device for applying an extraction voltage between the cold field emitter and the extractor device;
   the electron beam device further comprising:
   electron beam optics for directing and focusing the primary electron beam onto the specimen; and,
   a detector device for detecting secondary charged particles generated at an impingement or hitting of the primary electron beam on the specimen.

2. The electron beam device according to claim 1, wherein the intermediate area has a bent shape, in particular wherein the intermediate area has a curvature with a radius of between 50 nm and 500 nm.

3. The electron beam device according to claim 1, wherein the emitter tip is a monocrystalline emitter tip.

4. The electron beam device according to claim 1, wherein the emitter tip is a crystalline emitter tip and wherein at least a portion of the intermediate area of the emitter tip lies in a crystallographic plane 310 with respect to the optical axis of the electron beam device.

5. The electron beam device according to claim 1, wherein the electron beam optics comprises at least one of a compound objective lens, an immersion condenser lens, and a deflection device for deflecting the primary electron beam.

6. A cold field emitter for emitting an electron beam for an electron beam device, the cold field emitter comprising:
   an emitter tip having a tip surface; and
   two or more adjacent facets formed at the tip surface and having facet boundaries, each of the two or more facets forming a recess in the emitter tip, wherein the two or more facets are separated,
   wherein an intermediate area is provided between and around the two or more adjacent facets, wherein the intermediate area is configured for electron emission.

7. The cold field emitter according to claim 6, wherein the intermediate area has a bent shape.

8. The cold field emitter according to claim 6, wherein the intermediate area has a curvature with a radius of between 50 nm and 500 nm.

9. The cold field emitter according to claim 6, wherein the intermediate area has a curvature with a radius of between 150 nm and 300 nm.

10. The cold field emitter according to claim 6, wherein the emitter tip is a monocrystalline emitter tip.

11. The cold field emitter according to claim 6, wherein the two or more adjacent facets are formed in at least one of a crystallographic plane 100 and 110 of the emitter tip.

12. The cold field emitter according to claim 6, wherein the emitter tip is a crystalline emitter tip and wherein at least a part of the intermediate area lies in a crystallographic plane 310 of the emitter tip.

13. The cold field emitter according to claim 6, wherein the two or more adjacent facets have a round shape.

14. The cold field emitter according to claim 6, wherein the emitter tip comprises or is made of a refractory metal, and, in particular, is chosen from the group consisting of tungsten, tantalum, rhenium, molybdenum, niobium, platinum, Iridium, a carbide material, and a boride material.

15. The cold field emitter according to claim 6, wherein the intermediate area has a width between the two or more adjacent facets of between 100 and 300 atoms.

16. The cold field emitter according to claim 6, wherein a work function for electron emission is less in the intermediate area than at the two or more facets.

17. A method for producing an emitter tip for a cold field emitter for a source of an electron beam, comprising
   providing an emitter tip having an emitter tip surface; and
   processing the emitter tip by etching the emitter tip, heating the emitter tip, and applying an electrical field to the emitter tip,
   wherein two or more adjacent facets are formed into the emitter tip, and wherein an intermediate area is left between and around the two or more adjacent facets, the intermediate area being configured for electron emission.

18. The method according to claim 17, wherein processing the emitter tip includes forming two or more adjacent facets having a round shape.

19. A method for operating an electron beam device comprising:
   providing an electron beam source having a cold field emitter and an extractor device, wherein the cold field emitter comprises an emitter tip having a tip surface and two or more adjacent facets formed into the emitter tip, each of the two or more facets forming a recess in the emitter tip, wherein an intermediate area is provided between and around the two or more adjacent facets;
   applying an extraction voltage between the cold field emitter and the extractor device of the electron beam source; and
   emitting electrons from the intermediate area.

20. The method according to claim 19, wherein the emitter tip is a monocrystalline emitter tip and wherein emitting electrons from the intermediate area comprises emitting the electrons from at least a portion of the intermediate area lying in a crystallographic plane 310 of the monocrystalline emitter tip.

* * * * *